United States Patent
Zhang et al.

(10) Patent No.: US 6,920,260 B2
(45) Date of Patent: Jul. 19, 2005

(54) BISTABLE MOLECULAR MECHANICAL DEVICES WITH A MIDDLE ROTATING SEGMENT ACTIVATED BY AN ELECTRIC FIELD FOR ELECTRONIC SWITCHING, GATING, AND MEMORY APPLICATIONS

(75) Inventors: Xiao-An Zhang, Sunnyvale, CA (US); R Stanley Williams, Mt View, CA (US); Robert G Walmsley, Palo Alto, CA (US); Kent Vincent, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 84 days.

(21) Appl. No.: 10/660,277

(22) Filed: Sep. 10, 2003

(65) Prior Publication Data

US 2004/0066677 A1 Apr. 8, 2004

Related U.S. Application Data

(60) Division of application No. 10/003,869, filed on Oct. 24, 2001, now Pat. No. 6,830,842, which is a continuation of application No. 09/846,135, filed on Apr. 30, 2001, now Pat. No. 6,674,932, which is a continuation-in-part of application No. 09/823,195, filed on Mar. 29, 2001, which is a continuation-in-part of application No. 09/759,438, filed on Jan. 12, 2001, now Pat. No. 6,512,119, which is a continuation-in-part of application No. 09/738,793, filed on Dec. 14, 2000, now Pat. No. 6,663,797.

(51) Int. Cl.$^7$ .................................................. G02B 6/26
(52) U.S. Cl. ............................. 385/16; 385/40; 365/151
(58) Field of Search .............................. 385/16, 2, 6, 8, 385/25, 40; 136/252, 256; 252/585, 587; 365/151; 257/40, 200

(56) References Cited

U.S. PATENT DOCUMENTS

| 6,031,756 A | | 2/2000 | Gimzewski et al. ......... 365/151 |
| 6,090,332 A | * | 7/2000 | Marder et al. ............... 264/435 |
| 6,128,214 A | | 10/2000 | Kuekes et al. ............... 365/151 |
| 6,402,994 B1 | * | 6/2002 | Marder et al. ............... 252/582 |
| 6,559,374 B2 | * | 5/2003 | Lindsey et al. .............. 136/263 |

OTHER PUBLICATIONS

U.S. Appl. No. 09/280,048 entitled "Chemically Synthesized and Assembled Electronic Devices", filed on Mar. 29, 1999.

(Continued)

*Primary Examiner*—K. Cyrus Kianni

(57) ABSTRACT

A molecular system is provided for electric field activated switches, such as a crossed-wire device or a pair of electrodes to which the molecular system is linked by linking moieties. The crossed-wire device comprises a pair of crossed wires that form a junction where one wire crosses another at an angle other than zero degrees and at least one connector species connecting the pair of crossed wires in the junction. The connector species comprises the molecular system, which has an electric field induced band gap change, and thus a change in its electrical conductivity, that occurs via one a molecular conformation change, based on a rotor/stator construction of the molecular system, involving a rotating portion (rotor) connected between to stationary portions (stators). Nanometer-scale reversible electronic switches are thus provided that can be assembled easily to make cross-bar circuits, which provide memory, logic, and communication functions.

23 Claims, 3 Drawing Sheets

OTHER PUBLICATIONS

U.S. Appl. No. 09/280,225 entitled "Molecular Wire Crossbar Interconnects for Signal Routing and Communications", filed on Mar. 29, 1999.

U.S. Appl. No. 09/280,045 entitled "Molecular Wire Crossbar Logic", filed on Mar. 29, 1999.

U.S. Appl. No. 09/280,049 entitled "Demultiplexer for a Molecular Wire Crossbar Network", filed on Mar. 29, 1999.

U.S. Appl. No. 09/280,188 entitled "Molecular Wire Transistors" filed on Mar. 29, 1999.

C.P. Collier et al, "Electronically Configurable Molecular–Based Logic Gates", Science, vol. 285, pp. 391–394 (Jul. 16, 1999).

C.P. Collier et al, "A [2]Catenane–Based Solid State Electronically Reconfigurable Switch", Science, vol. 289, pp. 1172–1175 (Aug. 18, 1000).

A.M. Morales et al, "A laser ablation method for the synthesis of crystalline semiconductor nanowires", Science, vol. 279, pp. 208–211 (Jan. 9, 1998).

J.R. Heath et al, "A liquid solution synthesis of single crystal germanium quantum wires", Chemical Physics Letters, vol. 208, pp. 263–268 (Jun. 11, 1993).

V.P. Menon et al., "Fabrication and Evaluation of Nano–electrode Ensembles", Analytical Chemisstry, vol. 67, pp. 1920–1928 (Jul. 1, 1995).

T. Vossmeyer et al, "Combinatorial approaches toward patterning nanocrystals", Journal of Applied Physics, vol. 84, pp. 3664–3670 (Oct. 1, 1998).

D.V. Leff et al, "Thermodynamic Control of Gold Nanocrystal Size: Experiment and Theory", The Journal of Physical Chemistry, vol. 99, pp. 7036–7041 (May 4, 1995).

J.D.L. Holloway et al, "Electron–transfer reactions of metallocenes: Influence of metal oxidation state on structure and reactivity", Journal of the American Chemical Society, vol. 101, pp. 2038–2044 (Apr. 11, 1979).

\* cited by examiner

BISTABLE MOLECULAR MECHANICAL DEVICES WITH A MIDDLE ROTATING SEGMENT ACTIVATED BY AN ELECTRIC FIELD FOR ELECTRONIC SWITCHING, GATING, AND MEMORY APPLICATIONS

CROSS-REFERENCE TO RELATED APPLICATIONS

The present application is a division of Ser. No. 10/003,869 filed Oct. 24, 2001, now U.S. Pat. No. 6,830,842 which is a divisional application of Ser. No. 09/846,135, filed Apr. 30, 2001 now U.S. Pat. No. 6,674,932, which in turn is a continuation-in-part application of Ser. No. 09/823,195, filed Mar. 29, 2001, which in turn is a continuation-in-part application of Ser. No. 09/759,438, filed Jan. 12, 2001, now U.S. Pat. No. 6,512,119, issued Jan. 28, 2003, which in turn is a continuation-in-part application of Ser. No. 09/738,793, filed Dec. 14, 2000 now U.S. Pat. No. 6,663,797.

The present application is also related to the following applications and patents: Ser. No. 09/280,048 ("Chemically Synthesized and Assembled Electronic Devices"), now U.S. Pat. No. 6,459,095, issued Oct. 1, 2002; Ser. No. 09/280,225 ("Molecular Wire Crossbar Interconnect for Signal Routing and Communications"), now U.S. Pat. No. 6,314,019, issued Nov. 6, 2001; Ser. No. 09/282,045 ("Molecular Wire Crossbar Logic"); Ser. No. 09/282,049 ("De-multiplexer for a Molecular Wire Crossbar Network"), now U.S. Pat. No. 6,256,767, issued Jul. 3, 2001, all filed on Mar. 29, 1999, and Ser. No. 09/699,080, filed on Oct. 26, 2000, which is a divisional application of Ser. No. 09/280,188, filed on Mar. 29, 1999 ("Molecular Wire Transistors"), now abandoned, U.S. Pat. No. 6,128,214, issued on Oct. 3, 2000 ("Molecular Wire Crossbar Memory"), and U.S. Pat. No. 6,559,468, issued May 6, 2003, which is a divisional application of Ser. No. 09/280,188, filed on Mar. 29, 1999, now abandoned.

The present application is an improvement over the foregoing applications and patent in that it is directed to a class of molecules that provides switching from one state to a different state, characterized by a change in the electrical conductivity.

TECHNICAL FIELD

The present invention relates generally to electronic devices whose functional length scales are measured in nanometers, and, more particularly, to classes of molecules that provide electronic switching. Electronic devices both of micrometer and nanometer scale may be constructed in accordance with the teachings herein.

BACKGROUND ART

The area of molecular electronics is in its infancy. To date, there have been two convincing demonstrations of molecules as electronic switches published in the technical literature; see, C. P. Collier et al., Science, Vol. 285, pp. 391–394 (16 Jul. 1999) and C. P. Collier et al., Science, Vol. 289, pp. 1172–1175 (18 Aug. 2000), but there is a great deal of speculation and interest within the scientific community surrounding this topic. In the published work, a molecule called a rotaxane or a catenane was trapped between two metal electrodes and caused to switch from an ON state to an OFF state by the application of a positive bias across the molecule. The ON and OFF states differed in resistivity by about a factor of 100 and 5, respectively, for the rotaxane and catenane.

The primary problem with the rotaxane was that it is an irreversible switch. It can only be toggled once. Thus, it can be used in a programmable read-only memory (PROM), but not in a ROM-like device nor in a reconfigurable system, such as a defect-tolerant communications and logic network. In addition, the rotaxane requires an oxidation and/or reduction reaction to occur before the switch can be toggled. This requires the expenditure of a significant amount of energy to toggle the switch. In addition, the large and complex nature of rotaxanes and related compounds potentially makes the switching times of the molecules slow. The primary problems with the catenanes are small ON-to-OFF ratio and a slow switching time.

Thus, what is needed is a molecular system that avoids chemical oxidation and/or reduction, permits reasonably rapid switching from a first state to a second, is reversible to permit the fabrication of ROM-like devices, and can be used in a variety of electronic devices.

DISCLOSURE OF INVENTION

In accordance with the present invention, a molecular system is provided for nanometer-scale reversible electronic switches, specifically, electric field activated molecular switches that have an electric field induced band gap change that occurs via a molecular conformation change or an isomerization. Changing of extended conjugation via chemical bonding change to change the band gap is accomplished by providing the molecular system with one rotating portion (rotor) and two stationary portions (stators), between which the rotor is attached.

The present invention provides nanometer-scale reversible electronic switches that can be assembled easily to make cross-bar and other circuits. The cross-bar circuits have been described in the above-listed series of patent applications and issued patent. The circuits provide memory, logic and communications functions. One example of the electronic switches is the so-called crossed-wire device, which comprises a pair of crossed wires that form a junction where one wire crosses another at an angle other than zero degrees and at least one connector species connecting the pair of crossed wires in the junction. The junction has a functional dimension in nanometers or larger for multilayers. The connector species comprises the molecular system disclosed and claimed herein.

The present invention introduces a new type of switching mechanism, namely, an electric field induced rotation of a rotatable middle section (rotor) of a molecule. Thus, the molecule is neither oxidized nor reduced in the toggling of the switch, which avoids the necessity of breaking chemical bonds and potentially initiating a nonreversible reaction. Also, the part of the molecule that moves is quite small so the switching time should be very fast. Also, the molecules are much simpler and thus easier and cheaper to make than the rotaxanes and related compounds.

The devices of the present invention are generically considered to be electric field devices, and are to be distinguished from earlier embodiments (described in the above-mentioned related patent applications and patent) that are directed to electrochemical devices.

The molecular system of the present invention is expected to find use in a variety of applications, including, but not limited to, memories, logic devices, multiplexers, demultiplexers, configurable interconnects for integrated circuits, field-programmable gate arrays (FGPAs), cross-bar switches, and communication devices, such as cellular phones, mobile appliances, and PDAs.

BRIEF DESCRIPTION OF THE DRAWINGS

FIG. 1b is a perspective elevational view, depicting the device shown in FIG. 1a;

BEST MODES FOR CARRYING OUT THE INVENTION

Definitions

As used herein, the term "self-aligned" as applied to "junction" means that the junction that forms the switch and/or other electrical connection between two wires is created wherever two wires, either of which may be coated or functionalized, cross each other, because it is the act of crossing that creates the junction.

The term "self-assembled" as used herein refers to a system that naturally adopts some geometric pattern because of the identity of the components of the system; the system achieves at least a local minimum in its energy by adopting this configuration.

The term "singly configurable" means that a switch can change its state only once via an irreversible process such as an oxidation or reduction reaction; such a switch can be the basis of a programmable read-only memory (PROM), for example.

The term "reconfigurable" means that a switch can change its state multiple times via a reversible process such as an oxidation or reduction; in other words, the switch can be opened and closed multiple times, such as the memory bits in a random access memory (RAM).

The term "bi-stable" as applied to a molecule means a molecule having two relatively low energy states separated by an energy (or activation) barrier. The molecule may be either irreversibly switched from one state to the other (singly configurable) or reversibly switched from one state to the other (reconfigurable).

Micron-scale dimensions refers to dimensions that range from 1 micrometer to a few micrometers in size.

Sub-micron scale dimensions refers to dimensions that range from 1 micrometer down to 0.05 micrometers.

Nanometer scale dimensions refers to dimensions that range from 0.1 nanometers to 50 nanometers (0.05 micrometers).

Micron-scale and submicron-scale wires refers to rod or ribbon-shaped conductors or semiconductors with widths or diameters having the dimensions of 0.05 to 10 micrometers, heights that can range from a few tens of nanometers to a micrometer, and lengths of several micrometers and longer.

Basic Information on Prior Art Crossed Wire Switches

Figure 1A:
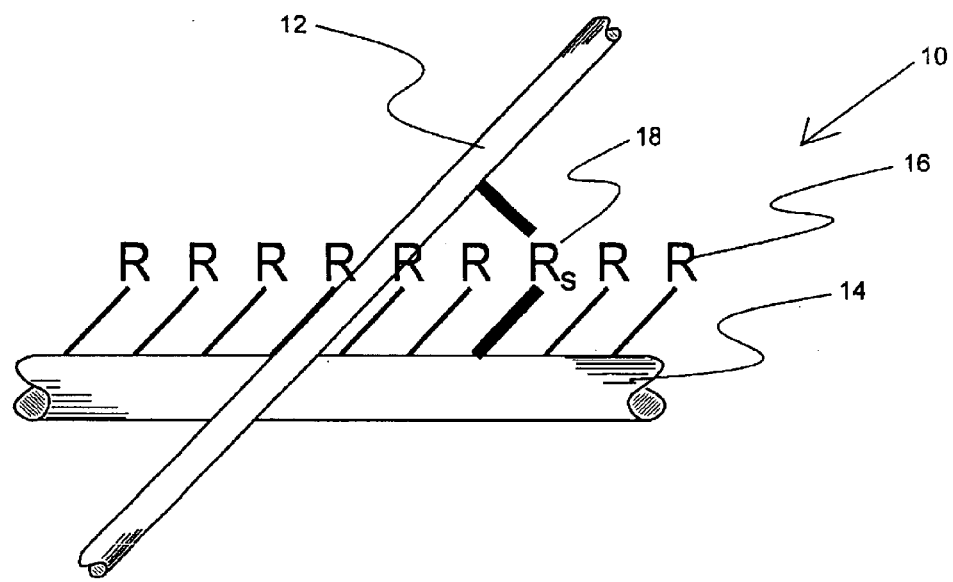
FIG. 1a is a schematic representation of two crossed wires, with at least one molecule at the intersection of the two wires.
Figure 1B:
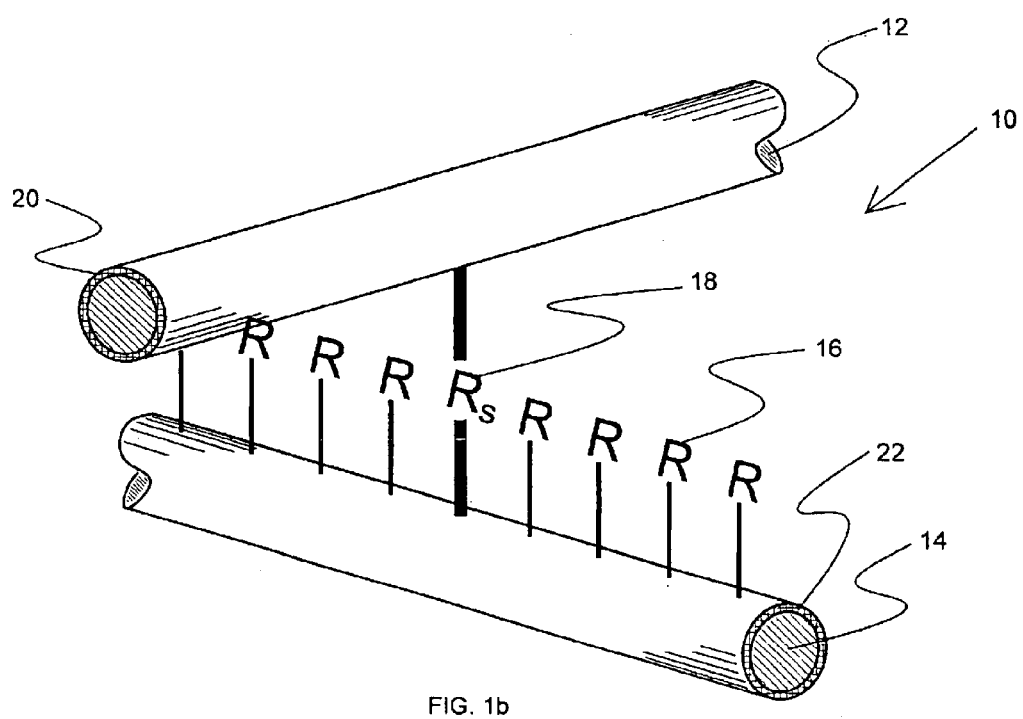

The essential device features are shown in FIGS. 1a–1b and are discussed in greater detail in the above-related patent applications and paten. A crossed wire switch 10 comprises two wires 12, 14, each either a metal or semiconductor wire, that are crossed at some non-zero angle. In between those wires is a layer of molecules or molecular compounds 16, denoted R in FIGS. 1a and 1b. The particular molecules 18 (denoted $R_s$,) that are sandwiched at the intersection of the two wires 12, 14 are identified as switch molecules, also interchangeable referred to herein as a junction. When an appropriate voltage is applied across the wires, the switch molecules are either oxidized or reduced. When a molecule is oxidized (reduced), then a second species is reduced (oxidized) so that charge is balanced. These two species are then called a redox pair. One example of this device would be for one molecule to be reduced, and then a second molecule (the other half of the redox pair) is oxidized. In another example, a molecule is reduced, and one of the wires is oxidized. In a third example, a molecule is oxidized, and one of the wires is reduced. In a fourth example, one wire is oxidized, and an oxide associated with the other wire is reduced. In all cases, oxidation or reduction will affect the tunneling distance or the tunneling barrier height between the two wires, thereby exponentially altering the rate of charge transport across the wire junction, and serving as the basis for a switch.

The electrical tasks performed by these devices are largely determined by the types of wires (electrodes) and the interwire materials that are used. Table I presents the various types of devices that might be fabricated from various combinations of the wires 12, 14 in FIGS. 1a–1b.

TABLE I

Wire (Electrode) Materials

| Device Type | Metal-metal (same) | Metal-metal (different) | Metal-semiconductor | Semiconductor-Semiconductor (p-n junction) | Semiconductor-semiconductor (hetero-junction) |
|---|---|---|---|---|---|
| Resistor | X | X | X | | |
| Tunneling resistor | X | X | X | | |
| Resonant tunneling resistor | X | X | X | | |
| Diode | | X | X | X | X |
| Tunneling diode | | X | X | X | X |
| Resonant tunneling diode | | X | X | X | X |
| Battery | | X | X | | X |

Depending on the molecules or materials that are used between the wires (the electrodes), each junction can either display the types of electrical function described below immediately on contact of the wires or the junction can have a switching function that acts to connect or disconnect the two wires together electrically. This switch can either be singly configurable or reconfigurable. In the first case, the initial state of the switch is open or closed. In the second case, by cycling the polarity and magnitude of the voltage on the switch beyond the appropriate threshold values, it is possible to reversibly oxidize or reduce the properly selected materials or molecules to close or open the switch many times. In either case, when closed, the type of electrical connection that is made between the wires depends upon the materials from which the wires (or electrodes) are fabricated as well as the identity of the molecules or materials between the wires.

Table I above shows a matrix of the various types of functions that can be obtained from various combinations of electrode materials and materials or molecules used in the junction. A resistor has a linear current-voltage characteristic, and is made by intentionally over-reducing the junction between various types of wires to essentially form a short circuit between the wires. The opposite of this process is to over-oxidize a junction, which will consume the wire in a localized region and effectively break the wire (create an open circuit) in that wire at the position of the junction. A tunneling resistor maintains a thin, approximately 2 nanometer thick, insulating barrier between wires and has an exponential current-voltage characteristic. In the case that junction molecules or materials have a sharply defined energy state inside the band gap of an electrically insulating barrier that can be accessed by electrically biasing the junction, the connection between the wires can exhibit a flow of electrical current that is dominated by the process of resonant tunneling. The resonant tunneling can produce one or more inflection points in the otherwise exponential current-voltage characteristic of a tunneling resistor. A diode is a junction that passes current more easily in one direction than in the other, and thus has an asymmetry in the current-voltage characteristic for positive and negative voltages. A tunneling diode has both the positive-negative voltage asymmetry of the diode and the exponential current- voltage characteristic of the tunneling resistor. A resonant tunneling diode has a positive-negative voltage asymmetry plus it has a peak in its current-voltage characteristic, such that over a restricted range of increasing magnitude of the voltage the magnitude of the current actually decreases, a phenomenon that is known as negative differential resistivity. In general, any real junction between wires formed by the processes described above will actually have two or more of the electrical functions described, with the effective circuit elements connected in series.

Thus, the present invention may be executed with any number of metallic or semiconducting wire/molecule combinations, depending on the device properties desired from the assembled circuit.

Basic Information on Prior Art Fabrication of Wire Electrodes

Process-Defined Wires (defined as wires that are prepared by conventional electronic-circuit processing techniques; wires are typically prepared on a substrate as part of a circuit):

Metallic and semiconductor wires, with diameters ranging from several micrometers to a single micrometer (defined as micrometer-scale), or with diameters ranging from a single micrometer down to 40 nanometers (defined as sub-micrometer scale) in diameter, may be prepared using well-established art, including lithographic (optical, ultraviolet, or electron beam) technologies. These wires normally have a ribbon shape or rectangular cross section, although circular cross sections are not precluded, with the width of the wire being determined by the lithographic process used to define the wire and its height being defined by the amount of material deposited in the region defined by lithography.

Chemically-Prepared Wires (these wires are prepared by techniques other than conventional electronic processing technology; wires are typically prepared as a bulk material, rather than as part of a circuit board):

Metal and semiconductor nanowires are defined as wires with diameters below 50 nanometers (typically 2 to 20 nanometers), and with lengths in the range of 0.1 micrometers to 50 micrometers (typically 5 to 10 micrometers). These may be prepared chemically using any one of a number of techniques described in the references given below.

One example of a reported technique for the production of semiconductor nanowires of the semiconducting element germanium is to react germanium tetrachloride and phenyl-trichlorogermanium with a dispersion of sodium metal in the solvent toluene, and at a temperature near 300° C. in a closed vessel, under an inert environment, for a period of several days. That preparation produces single-crystal germanium nanowires of diameters three to thirty nanometers, and of lengths from 0.5 to 10 micrometers.

A second example of a reported technique for the production of semiconductor nanowires of the semiconducting element silicon, is to laser vaporize a target containing elemental silicon and iron. The target is placed in a vacuum oven at 1300° C., and an inert gas is flowed through the oven during the vaporization process. This technique produces silicon wires that have diameters in the range of 20 to 30 nanometers, and lengths ranging from 1 to 20 micrometers.

One example of a reported technique for the production of metallic nanowires of the metallic element gold is to electrochemically grow gold wires within the pores of an anodically etched aluminum oxide thin film. The aluminum oxide is dissolved in acidic solution, releasing the gold nanowires, which are then collected. Gold nanowires grown in this manner are characterized by diameters ranging from 20 to 30 nanometers, and lengths ranging from 0.5 to 5 micrometers.

Nanowires of various metallic and semiconducting materials may be prepared in a variety of fashions. Some of these devices will require doped semiconductor wires, such as doped Si.

For the case of Si wires, the wires can be doped when the wires are physically prepared. In this case, it is necessary to add the dopant into the reaction vessel as the wires are formed. For example, in the laser ablation/vacuum oven preparation technique described above, a small amount of dopant gas, such as phosphorus trihydride ($PH_3$) or arsenic trihydride ($AsH_3$) is added into the inert gas (argon, for example) that flows through the vacuum oven during the laser ablation/wire formation process.

Conversely, these wires can be modulation-doped by coating their surfaces with appropriate molecules—either electron-withdrawing groups (Lewis acids, such as boron trifluoride ($BF_3$)) or electron-donating groups (Lewis bases, such as alkylamines) to make them p-type or n-type conductors, respectively. See wire preparation routes listed below. FIG. 1b depicts a coating 20 on wire 12 and a coating 22 on wire 14. The coatings 20, 22 may be modulation-doping coatings, tunneling barriers (e.g., oxides), or other nano-scale functionally suitable materials. Alternatively, the wires 12, 14 themselves may be coated with one or more R species 16, and where the wires cross, $R_s$, 18 is formed. Or yet alternatively, the wires 12, 14 may be coated with molecular species 20, 22, respectively, for example, that enable one or both wires to be suspended to form colloidal suspensions, as discussed below.

To dope the wires via modulation-doping, it is necessary to chemically functionalize the surface of the wires using organic or inorganic molecules that will covalently bind to the Si—O—H groups at the surface of the wires. When silicon nanowires are exposed to air, a thin surface layer (1 nm) of $SiO_2$ will naturally form, and at the $SiO_2$/air interface, the $SiO_2$ surface is terminated by Si—O—H bonds. Groups that will bind to or replace Si—O—H groups are not limited to but include R—Si$(CH_3)_x(OCH_{3-x})$, R—Si$(CH_3)_x(OCH_2CH_{3-x})$, R—Si$(CH_3)_xCl_{3-x}$, and others. In this case, R represents an organic or inorganic moiety that can contain electron-withdrawing (a Lewis acid) or electron-donating groups (a Lewis base). This chemistry of binding molecules to a $SiO_2$ passivated silicon surface is well established. One published example reaction for binding molecules to the surface of $SiO_2$ passivated silicon is:

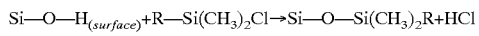

Si—O—H$_{(surface)}$+R—Si$(CH_3)_2$Cl→Si—O—Si$(CH_3)_2$R+HCl

Other semiconductor wires can be functionalized with organo-amines, organo-thiols, organo-phosphates, etc.

Apparently, no previous description of how to modulation-dope chemically synthesized semiconductor wires has yet appeared in the technical literature.

For the case of other nanowires, such as metal nanowires, the wires can be chemically functionalized with R—SH (for gold or silver wires), or R—$NH_2$ (for platinum wires and palladium wires), or R—$CO_2$H for other metals such as $Al_2O_3$— coated aluminum wires or titanium wires),where the R-group denotes some organic moiety that will lend the wire certain chemical properties—such as the property that will allow the person skilled in the art to disperse the wires, as a colloid, in a solvent. In one example, gold wires might be functionalized with dodecanethiol ($C_{12}H_{25}$SH). The dodecanethiol not only will provide the wires with a thin surface tunneling barrier, but will also allow for the wires to be dispersed in simple organic solvents, such as hexane or chloroform.

Basic Information on Prior Art Wire Preparation Routes

The following materials may be prepared as nanowires according to the reference listed.

Silicon: A. M. Morales et al, "A laser ablation method for the synthesis of crystalline semiconductor nanowires", *Science*, Vol. 279, pp. 208–211 (Jan. 9, 1998).

Germanium: J. R. Heath et al, "A liquid solution synthesis of single crystal germanium quantum wires", *Chemical Physics Letters*, Vol. 208, pp. 263–268 (Jun. 11, 1993).

Metal Nanowires: V. P. Menon et al, "Fabrication and Evaluation of Nano-electrode Ensembles", *Analytical Chemistry*, Vol. 67, pp. 1920–1928 (Jul. 1, 1995).

Functionalizing Silicon: T. Vossmeyer et al, "Combinatorial approaches toward patterning nanocrystals", *Journal of Applied Physics*, Vol. 84, pp. 3664–3670 (Oct. 1, 1998) (one of a number of references).

Functionalizing the Surfaces of Gold Nanostructures: D.V. Leff et al, "Thermodynamic Size Control of Au Nanocrystals: Experiment and Theory", *The Journal of Physical Chemistry*, Vol. 99, p. 7036–7041 (May 4, 1995).

Molecular switching components may come from any number of different classes of molecules, depending, again, on the desired properties of the device. The key requirement of the molecules is that, when they are sandwiched between two wires, they may be electrochemically modified (i.e. oxidized or reduced) by applying a voltage across the wires. When the molecular components are so modified, the net effect is that the tunneling barrier between the two wires is modified, and the rate of current flow is changed. This forms the basis of a switch that can, in turn, be used for memory, logic operations, and communication and signal routing networks. Molecular switches can include redox pairs of molecules, in which application of a voltage reduces one of the molecules and oxidizes the other. An example of such a molecular redox pair might be: nickelocene (di-cyclopentadienyl nickel), or $Cp_2Ni$, with tetrabutylammonium hexafluorophosphate ($Bu_4NPF_6$). The reaction, then, would be:

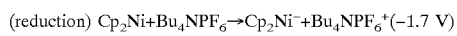

(reduction) $Cp_2Ni+Bu_4NPF_6 \rightarrow Cp_2Ni^- + Bu_4NPF_6^+ (-1.7$ V)

or

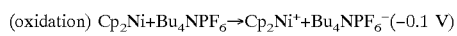

(oxidation) $Cp_2Ni+Bu_4NPF_6 \rightarrow Cp_2Ni^+ + Bu_4NPF_6^- (-0.1$ V)

The nickelocene system is of particular interest in that the reduction, as probed by solution phase cyclic voltammetry, is highly asymmetric. Such asymmetry is analogous to magnetization hysteresis curves that form the basis for stable and rewriteable magnetic memory. However, in the presence of oxygen, the reduction of nickelocene is irreversible, as probed by solution phase voltammetry. In either case, reduction or oxidation of this system will modify the tunneling barrier between the two wires between which the molecules are sandwiched. Thus, this system could operate as either a reconfigurable, or a singly configurable molecular switch. For metallocene systems, see, e.g., J. D. L. Holloway et al, "Electron-transfer reactions of metallocenes: Influence of metal oxidation state on structure and reactivity", *Journal of the American Chemical Society*, Vol. 101, pp. 2038–2044 (Apr. 11, 1979).

The connector species 16 comprises a material that displays a significant, or measurable, hysteresis in its current-voltage curve, obtained either from solution electrochemistry or from current-voltage characteristics in a solid-state junction. Examples of such species include metallocenes, rotaxanes, pseudo-rotaxanes, and catenanes, which rely on intramolecular hydrogen bonding. While such molecules are useful for the purpose disclosed, however, simple intramolecular hydrogen bonding forces are relatively easily exceeded under certain conditions, as discussed above.

Present Invention

The present invention turns molecules into active electronic devices that can be switched with an external electric field. The general idea is to design into the molecules a rotatable middle segment (rotor) that has a large dipole moment (see Examples 1 and 2, below) and that links two other portions of the molecule that are immobilized (stators). Under the influence of an applied electric field, the vector dipole moment of the rotor will attempt to align parallel to the direction of the external field. However, the molecule is designed such that there are inter- and /or intramolecular forces, such as hydrogen bonding or dipole-dipole interactions as well as steric repulsions, which stabilize the rotor in particular orientations with respect to the stators. Thus, a large field is required to cause the rotor to unlatch from its initial orientation and rotate with respect to the stators, if the direction of the applied field is opposite to that of the dipole of the rotor. Once switched into a particular orientation, the molecule will remain in that orientation until it is switched out. However, a key component of the molecule design is that there is a steric repulsion that will prevent the rotor from rotating through a complete 180 degree half cycle. Instead, the rotation is halted by the steric interaction of bulky groups on the rotor and stators at an angle of approximately 90 degrees from the initial orientation. Furthermore, this 90 degree orientation is stabilized by a different set of inter- and/or intramolecular hydrogen bonds or dipole interactions, and is thus latched into place even after the applied field is turned off. For switch molecules, this ability to latch the rotor between two states separated by approximately 90 degrees from the stators is crucial.

In the ideal case, for the orientation where the rotor and stators are all co-planar, the molecule is completely conjugated. Thus, the p,π-electrons of the molecule, through its highest occupied molecular orbital (HOMO) and lowest unoccupied molecular orbital (LUMO), are delocalized over the entire molecule. This is a high conductivity (switch ON) state for the molecule. In the case where the rotor is rotated by 90 degrees with respect to the stators, the conjugation of the molecule is broken and the HOMO and LUMO are no longer delocalized over the entire molecule. This is the low conductivity (switch OFF) state of the molecule. Thus, the molecule is reversibly switchable between the ON and OFF states.

The following requirements must be met in this stator-rotor-stator model:

(a) The molecule must have one rotor and two stator segments;

(b) In one state of the molecule, there should be delocalized HOMOs and/or LUMOs (π-states and/or non-bonding orbitals) that extend over a large portion of the entire molecule (rotor and stators), whereas in the other state, the orbitals are localized on the rotor and stators;

(c) The connecting unit between rotor and each stator can be a single σ-bond or at least one atom with (1) non-bonding electrons (p or other electrons), or (2) π-electrons, or (3) π-electrons and non-bonding electron(s);

(d) The non-bonding electrons, or π-electrons, or π-electrons and non-bonding electron(s) of the rotor and stators can be localized or de-localized depending on the conformation of the molecule, while the rotor rotates when activated by an E-field;

(e) The conformation(s) of the molecule can be E-field dependent or bi-stable;

(f) The bi-stable state(s) can be achieved by intra- or inter-molecular forces such as hydrogen bonding, Coulomb force, van der Waals force, metal ion complex or dipole inter-stabilization; and (g) The band gap of the molecule will change depending on the degree of non-bonding electron, or π-electron, or π-electron and non-bonding electron de-localization of the molecule. This will change the electrical properties, such as electrical conductivity, of the molecule.

Figure 2:
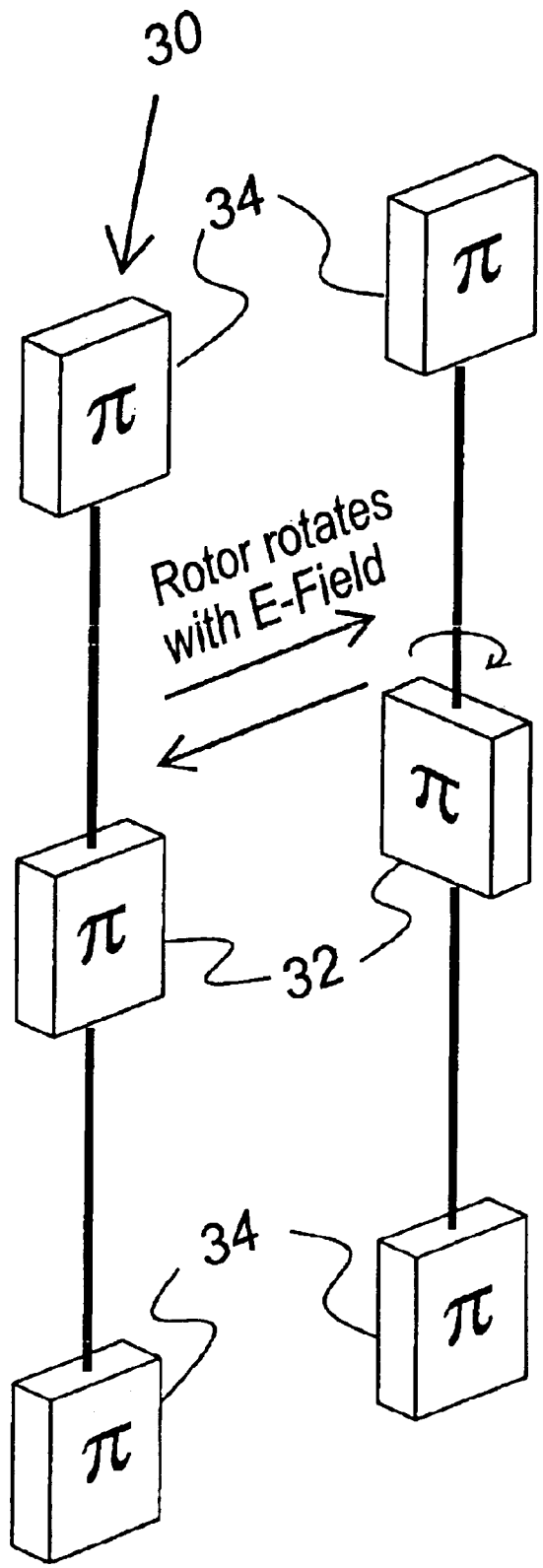
FIG. 2 is a schematic model depicting an E-field-induced band gap change via molecular conformation change (rotor/stator type of model)

Following are two examples of this model (Examples 1 and 2):

The novel bi-modal molecules of the present invention are active electrical devices that can be switched with an external electric field. The general idea is to design into the molecules a rotatable middle segment (rotor) 32 that has a large dipole moment (see Examples 1 and 2) and that links two other portions of the molecule 30 that are immobilized (stators) 34, as illustrated in FIG. 2. Under the influence of an applied electric field, the vector dipole moment of the rotor 32 will attempt to align parallel to the direction of the external field. However, the molecule 30 is designed such that there are inter- and/or intra-molecular forces, such as hydrogen bonding or dipole-dipole interactions as well as steric repulsions, that stabilize the rotor 32 in particular orientations with respect to the stators 34. Thus, a large electric field is required to cause the rotor 32 to unlatch from its initial orientation and rotate with respect to the stators 34.

Once switched into a particular orientation, the molecule 30 will remain in that orientation until it is switched to a different orientation, or reconfigured. However, a key component of the molecule design is that there is a steric repulsion or hindrance that will prevent the rotor 32 from rotating through a complete 180 degree half cycle. Instead, the rotation is halted by the steric interaction of bulky groups on the rotor 32 and stators 34 at an electrically significant angle of typically between 10° and 170° from the initial orientation. For the purposes of illustration, this angle is shown as 90° in the present application. Furthermore, this switching orientation may be stabilized by a different set of inter- and/or intra-molecular hydrogen bonds or dipole interactions, and is thus latched in place even after the applied field is turned off. For bi-stable switch molecules, this ability to latch the rotor 32 between two states separated by an electrically significant rotation from the stators is crucial.

When the rotor 32 and stators 34 are all co-planar, the molecule is referred to as "more-conjugated". Thus, the non-bonding electrons, or π-electrons, or π-electrons and non-bonding electrons of the molecule, through its highest occupied molecular orbital (HOMO) and lowest unoccupied molecular orbital (LUMO), are delocalized over a large portion of the molecule 30. This is referred to as a "more conductive state" for the molecule, or "electrical state I". In the case where the rotor 32 is rotated out of conjugation by approximately 10° to 170° with respect to the stators 34, the conjugation of the molecule 30 is broken and the HOMO and LUMO are localized over smaller portions of the molecule, referred to as "less-conjugated". This is a "less conductive state" of the molecule 30, or "electrical state II". Thus, the molecule 30 is reversibly switchable between two different electrical states.

It will be appreciated by those skilled in the art that in the ideal case, when the rotor 32 and stators 34 are completely coplanar, then the molecule is fully conjugated, and when the rotor 32 is rotated at an angle of 90° with respect to the stators 34, then the molecule is non-conjugated. However, due to thermal fluctuations, these ideal states are not fully realized, and the molecule is thus referred to as being "more-conjugated" in the former case and "less-conjugated" in the latter case.

Examples 1 and 2 show two different orientations for switching the molecules. In Example 1, the rotation axis of the rotor is designed to be nearly perpendicular to the net current-carrying axis of the molecules, whereas in Example 2, the rotation axis is parallel to the orientation axis of the molecule. These designs allow different geometries of molecular films and electrodes to be used, depending on the desired results. Both generic and real molecular structures are presented for each example. Examples 1 a and 2a are generic molecular structures to show two different orientations for switching the molecules, and Examples 1b and 2b are two real molecular structures.

Turning first to Example 1, this depicts a first embodiment of the bi-stable molecular mechanical device of the present invention. Example 1 a below depicts a generic molecular implementation for the stator-rotor-stator model.

where:

The letter $A^{31}$ represents an Acceptor group; it is an electron-withdrawing group. It may be one of following: hydrogen, carboxylic acid or its derivatives, sulfuric acid or its derivatives, phosphoric acid or its derivatives, nitro, nitrile, hetero atoms (e.g., N, O, S, P, F, Cl, Br), or functional group with at least one of above-mentioned hetero atoms (e.g., OH, SH, NH, etc.), hydrocarbon (either saturated or unsaturated) or substituted hydrocarbon.

The letter $D^+$ represents a Donor group; it is an electron-donating group. It may be one of following: hydrogen, amine, OH, SH, ether, hydrocarbon (either saturated or unsaturated), or substituted hydrocarbon or functional group with at least one of hetero atom (e.g., B, Si, N, O, S, P, I). The donor is differentiated from the acceptor by that fact that it is less electronegative, or more electropositive, than the acceptor group on the molecule.

The letters $Con_1$ and $Con_2$ represent connecting units between a molecule and the solid substrate (e.g., metal electrode, inorganic or organic substrate, etc.). They may be any one of the following: hydrogen (utilizing a hydrogen Example 1a

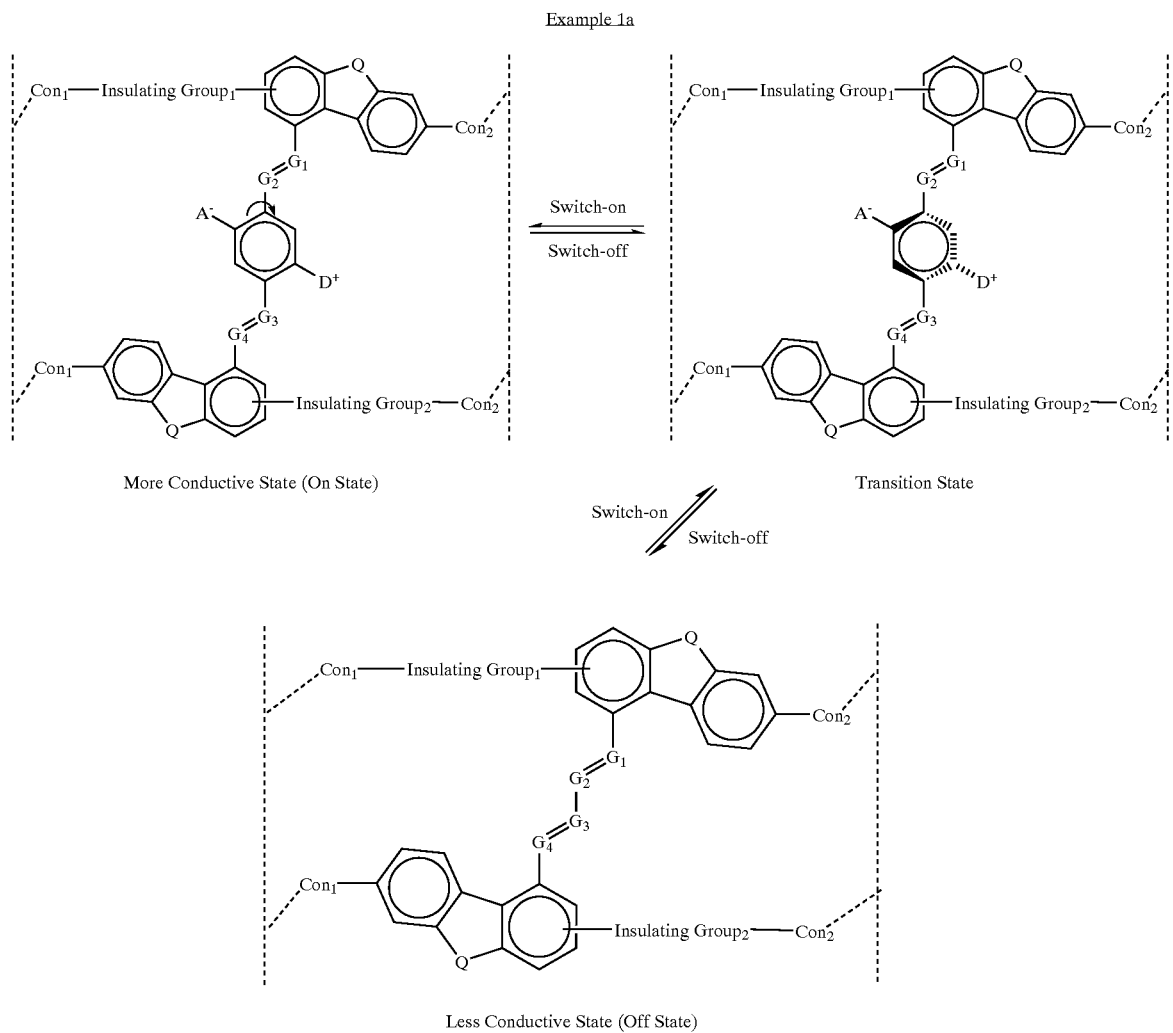

bond), multivalent hetero atoms (i.e., C, N, O, S, P, etc.) or functional groups containing these hetero atoms (e.g., NH, PH, etc.), hydrocarbons (either saturated or unsaturated) or substituted hydrocarbons.

The letters $G_1$, $G_2$, $G_3$, and $G_4$ are bridging groups. The function of these bridging groups is to connect the stator and rotor or to connect two or more conjugated rings to achieve a desired electronic property. They may be any one of the following: hetero atoms (e.g., N, O, S, P, etc.) or functional groups with at least one of above-mentioned hetero atoms (e.g., NH or NHNH, etc.), hydrocarbons (either saturated or unsaturated) or substituted hydrocarbons. The connector may alternately comprise a single atom bridge such as an ether bridge with an oxygen atom, or a direct sigma bond between the rotor and stator.

The letter Q is used here to designate a connecting unit between two phenyl rings. It can be any one of following: S, O, NH, NR, hydrocarbon, or substituted hydrocarbon.

In Example 1a above, the vertical dotted lines represent other molecules or solid substrates. The direction of the switching field is vertical dotted lines. Such a configuration is employed for electrical switching, and the molecule may be simply placed between the two electrodes.

Example 1b below is a real molecular example of the stator-rotor-stator model mentioned above:

Example 1b

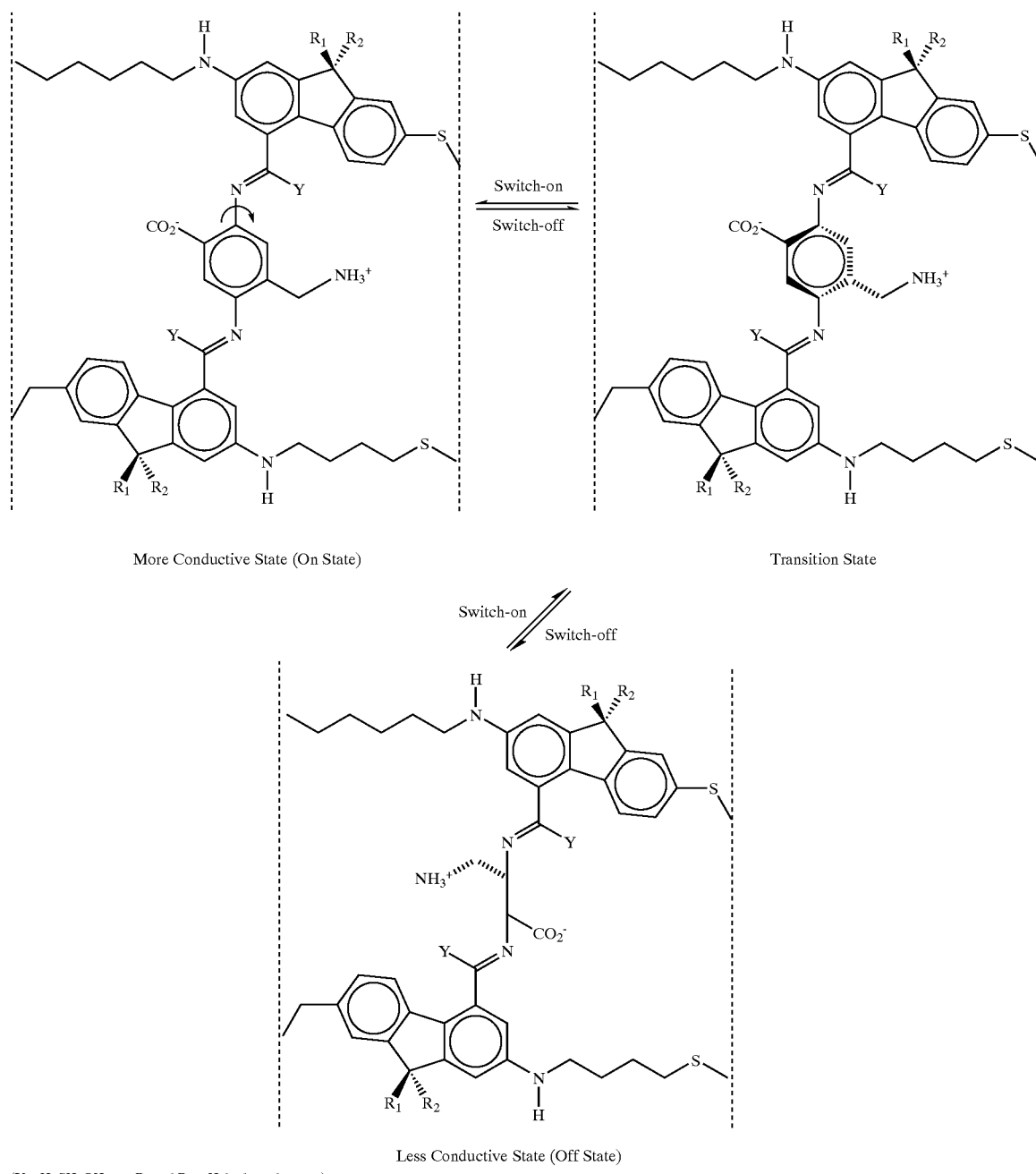

(Y = H, SH, OH, etc. $R_1$ and $R_2$ = H, hydrocarbon etc.)

The molecule shown above (Example 1b) has been designed with the internal rotor 32 perpendicular to the orientation or current-flow axis of the entire molecule 30. In this case, the external field is applied along the orientation axis of the molecule 30 as pictured—the electrodes (vertical dotted lines) are oriented perpendicular to the plane of the paper and perpendicular to the orientation axis of the molecule 30. Application of an electric field oriented from left to right in the diagrams will cause the rotor 32 as pictured in the upper left diagram to rotate to the position shown on the lower diagram, and vice versa. In this case, the rotor 32 as pictured in the lower diagram is not coplanar with the rest of the molecule, so this is the OFF or low conductivity state of the molecule, whereas the rotor is substantially coplanar with the rest of the molecule on the upper left diagram, so this is the ON or high conductivity state of the molecule. The structure shown in the upper right diagram depicts the transition state of rotation between the upper left diagram (co-planar, conjugated) and the lower diagram (central portion rotated, non-conjugated).

The molecule depicted in Example 1 is non-conductive (or comparatively low conductive) in the non-conjugated state. In the conjugated state, the molecule is conductive.

For molecules of the type shown in Example 1, a single monolayer molecular film is grown, for example using Langmuir-Blodgett techniques or self-assembled monolayers, such that the orientation axis of the molecules is perpendicular to the plane of the electrodes used to switch the molecules. Electrodes may be deposited in the manner described by Collier et al, supra, or methods described in the above-referenced patent applications and issued patent.

Turning now to Example 2, this depicts a second embodiment of the bi-stable molecular mechanical device of the present invention. Example 2a below depicts a second generic molecular example for stator-rotor-stator configuration of the present invention.

Example 2a

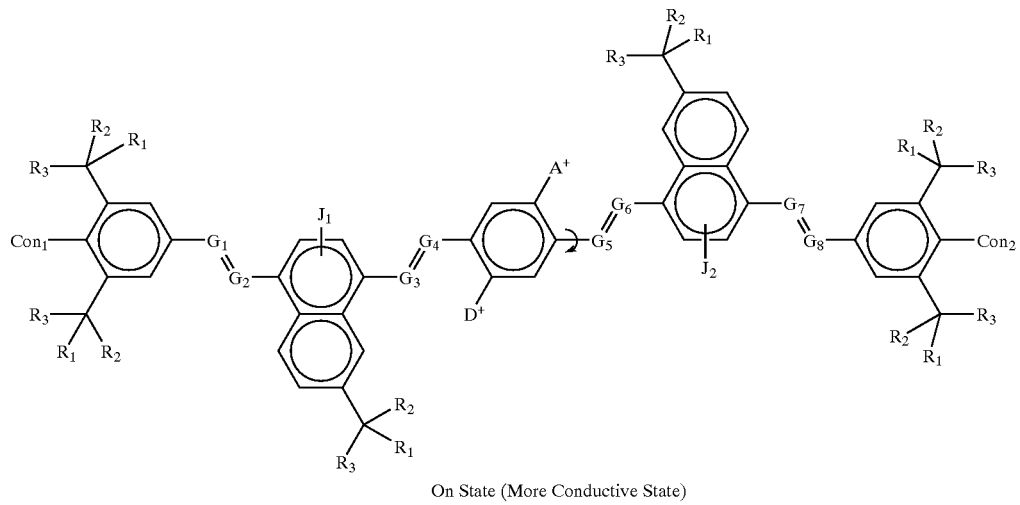

On State (More Conductive State)

Switch on ‖ Switch off

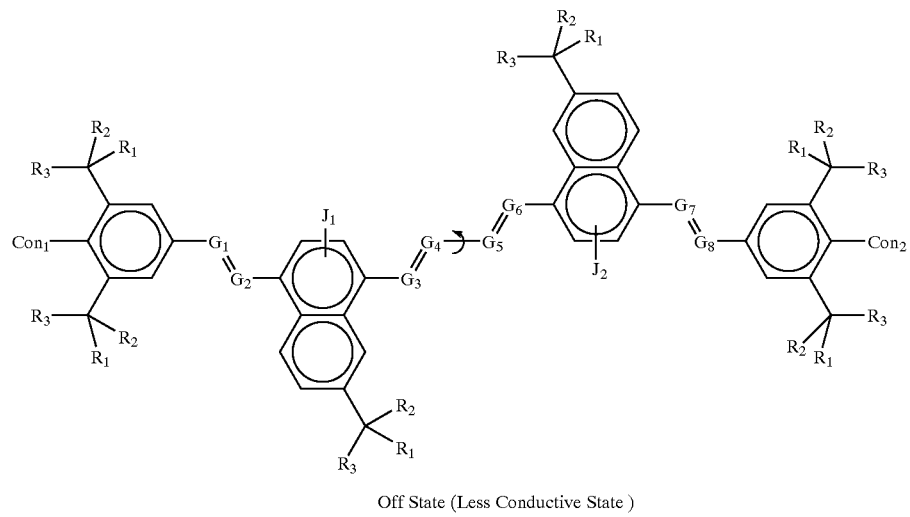

Off State (Less Conductive State)

where:

The letter A⁻ represents an Acceptor group; it is an electron-withdrawing group. It may be one of following: hydrogen, carboxylic acid or its derivatives, sulfuric acid or its derivatives, phosphoric acid or its derivatives, nitro, nitrile, hetero atoms (e.g., N, O, S, P, F, Cl, Br), or functional group with at least one of above-mentioned hetero atoms (e.g., OH, SH, NH, etc.), hydrocarbon (either saturated or unsaturated) or substituted hydrocarbon.

The letter D⁺ represents a Donor group; it is an electron-donating group. It may be one of following: hydrogen, amine, OH, SH, ether, hydrocarbon (either saturated or unsaturated), or substituted hydrocarbon or functional group with at least one of hetero atom (e.g., B, Si, I, N, O, S, P). The donor is differentiated from the acceptor by that fact that it is less electronegative, or more electropositive, than the acceptor group on the molecule.

The letters $Con_1$ and $Con_2$ represent connecting units between one molecule and another molecule or between a molecule and the solid substrate (e.g., metal electrode, inorganic or organic substrate, etc.). They may be any one of the following: hydrogen (utilizing a hydrogen bond), multivalent hetero atoms (i.e., C, N, O, S, P, etc.) or functional groups containing these hetero atoms (e.g., NH, PH, etc.), hydrocarbons (either saturated or unsaturated) or substituted hydrocarbons.

The letters $R_1$, $R_2$ and $R_3$ represent spacing groups built into the molecule. The function of these spacer units is to provide an appropriate 3-dimensional scaffolding to allow the molecules to pack together while providing rotational space for each rotor. They may be any one of the following: hydrogen, hydrocarbon (either saturated or unsaturated) or substituted hydrocarbon.

The letters $G_1$, $G_2$, $G_3$, $G_4$, $G_5$, $G_6$, $G_7$, and $G_8$ are bridging groups. The function of these bridging groups is to connect the stator and rotor or to connect two or more conjugated rings to achieve a desired electronic property. They may be any one of the following: hetero atoms (e.g., C, N, O, S, P, etc.) or functional group with at least one of above-mentioned hetero atoms (e.g., NH or NHNH, etc.), hydrocarbons (either saturated or unsaturated) or substituted hydrocarbons. The connector may alternately comprise a single atom bridge such as an ether bridge with an oxygen atom, or a direct sigma bond between the rotor and stator.

The letters $J_1$ and $J_2$ represent tuning groups built into the molecule. The function of these tuning groups (e.g., OH, NHR, COOH, CN, nitro, etc.) is to provide an appropriate functional effect (e.g. both inductive effect and resonance effects) and/or steric effects. The functional effect is to tune the band gap ($\Delta E_{HOMO/LUMO}$) of the molecule to get the desired electronic properties of the molecule. The steric effect is to tune the molecular conformation through steric hindrance, inter- or intra-molecular interaction forces (e.g. hydrogen bonding, Coulomb interaction, van der Waals forces) or to provide bi- or multiple-stability of molecular orientations. They may be any one of the following: hydrogen, hetero atoms (e.g., N, O, S, P, B, F, Cl, Br, and I), functional groups with at least one of above-mentioned hetero atoms, hydrocarbons (either saturated or unsaturated) or substituted hydrocarbons.

Example 2b below is a real molecular example of the stator-rotor-stator configuration mentioned above:

Example 2b

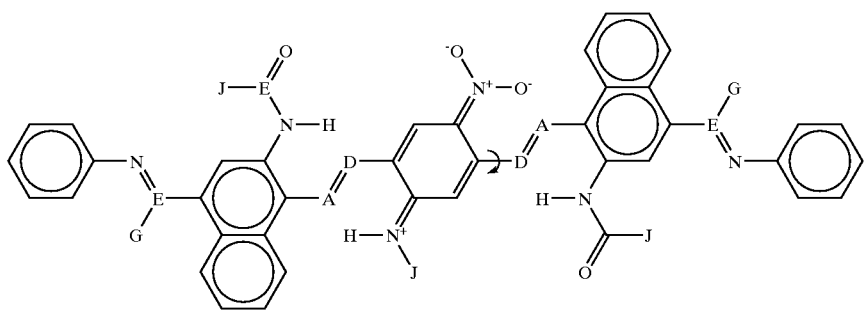

More Conductive State (On State)

Switch on || Switch off

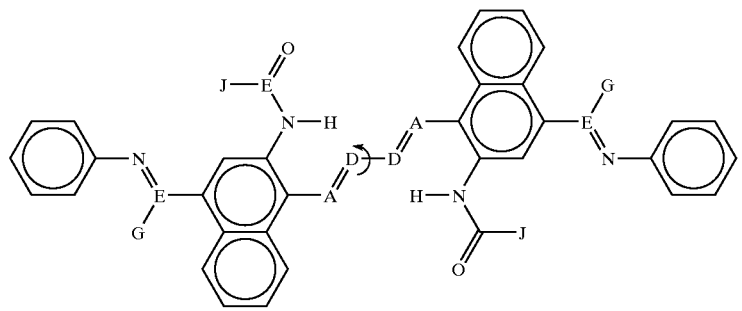

Less Conductive State (Off State)

The molecule shown above (Example 2b) has been designed with the internal rotor parallel to the orientation axis of the entire molecule. In this case, the external field is applied perpendicular to the molecular axis—the electrodes are oriented parallel to the long axis of the molecule and can be either perpendicular or parallel to the plane of the above model structures. For example, application of an electric field to the upper molecule shown above where the field lines are perpendicular to the molecular axis and pointing upward will cause the rotor as pictured in that diagram to rotate to approximately 90 degrees and appear edge on, as shown in the lower molecular diagram above, and vice versa. In this case, the rotor as pictured in the lower diagram is not coplanar with the rest of the molecule, so this is the OFF or low conductivity state of the molecule, whereas the rotor is coplanar with the rest of the molecule on the upper diagram, so this is the ON or high conductivity state of the molecule. In the diagram, the letters A, D, E, G, and J indicate sites where different chemical units can be utilized to adjust the geometrical structure of the molecule, and other chemical groups may also be used as the rotor and stators. (The letters N, H, and O retain their usual meaning.) The letters A, D, E, G, and J can be any of the following: heteroatoms (e.g., N, O, S, P, etc.), hydrocarbon (either saturated or unsaturated), or hydrocarbon with at least one of the above-mentioned heteroatoms. In addition to the foregoing, the letters G and J can be any of the following heteroatoms: hydrogen, F, Cl, Br, I, etc.

For the molecules of Example 2, the films are grown such that the molecular axis is parallel to the plane of the electrodes. This may involve films that are multiple monolayers thick. The molecules form solid-state or liquid crystals in which the large stator groups are locked into position by intermolecular interactions or direct bonding to a support structure, but the rotor is small enough to move within the lattice of the molecules. With the proper orientation of electrodes, this structure can be used to create a gated junction (transistor); i.e., one where a voltage applied to one electrode can control the current that flows between two other electrodes that are bridged by the molecules.

Although connector units are not shown in Examples 2a and 2b, such connector units, for example, —S—, depicted in Examples 1a and 1b, would be used to connect the molecule between a pair of electrodes, as depicted in Example 1. Specifically, connection is between the stator portions of the molecule and the electrodes.

Examples 1 and 2 show two different orientations for switching the molecules. However, the examples given are not to be considered limiting the invention to the specific molecular systems illustrated, but rather merely exemplary of the switching mechanism disclosed and claimed herein.

Thus, the present invention introduces a new type of switching mechanism that distinguish it from the prior art, namely, an electric field ("E-field") induced rotation of a rotatable section (rotor) of a molecule to change the band gap of the molecule. The molecule is never oxidized nor reduced in the toggling of the switch, in contrast to prior art approaches. Also, the part of the molecule that moves is quite small, so the switching time is expected to be quite fast. Also, the molecules are much simpler and thus easier and cheaper to make than the rotaxanes, catenanes, and related compounds.

The technology disclosed and claimed herein for forming crossed wires (micro-meter or nanometer) may be used to perform a variety of functions and to form a variety of useful devices and circuits for implementing computing on a microscale and even on a nanoscale. For example, applications include molecular wire crossbar interconnects (MWCI) for signal routing and communications, molecular wire crossbar memory (U.S. Pat. No. 6,128,214), molecular wire crossbar logic (MWCL) employing programmable logic arrays, a demultiplexer for a molecular wire crossbar network, molecular wire transistors, and pixel arrays for displays.

Figure 3:
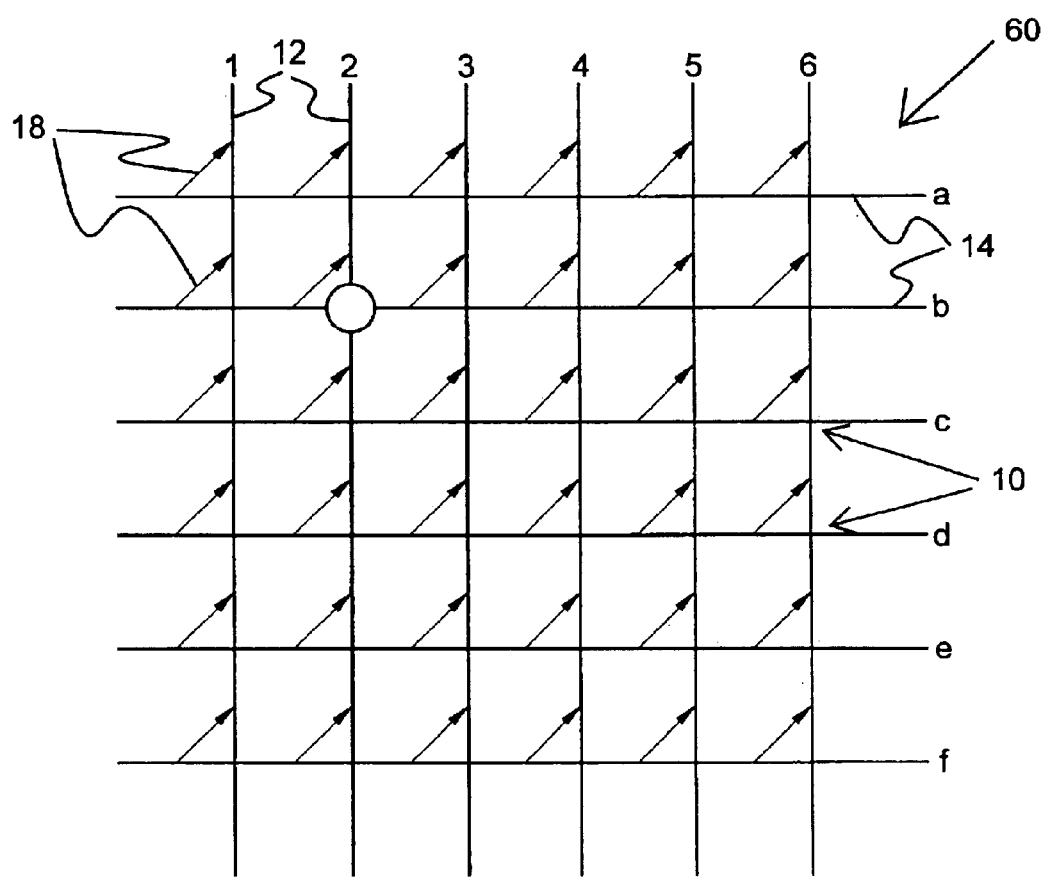
FIG. 3 is a schematic representation of a two-dimensional array of switches of the present invention, depicting a 6×6 crossbar switch.

As illustrated in FIG. 3, the switch 10 of the present invention can be replicated in a two-dimensional array to form a plurality, or array, 60 of switches to form a crossbar switch. FIG. 3 depicts a 6×6 array 60, but the invention is not so limited to the particular number of elements, or switches, in the array. Access to a single point, e.g., 2b, is done by impressing voltage on wires 2 and b to cause a change in the state of the molecular species 18 at the junction thereof, as described above. Thus, access to each junction is readily available for configuring only those pre-selected junctions in accordance with the teachings herein. Details of the operation of the crossbar switch array 60 are further discussed in above-referenced U.S. Pat. No. 6,128,214.

INDUSTRIAL APPLICABILITY

The field-switchable molecules disclosed herein are expected to find use in micro-scale and nano-scale electronic devices.

What is claimed is:

1. A bi-stable molecular mechanical device comprising a molecular system configured within an electric field generated by a pair of electrodes and electrically connected thereto, said molecular system having one rotor portion connected between two stator portions, wherein said rotor portion has a dipole moment sufficient to be responsive to said electric field and wherein said rotor portion rotates with respect to said stator portions between at least two different states upon application of said electric field, thereby inducing a band gap change in said molecular system, wherein in a first state, there is extended conjugation over at least most of said molecular system, resulting in a relatively smaller band gap, and wherein in a second state, said extended conjugation is changed, resulting in a relatively larger band gap.

2. The molecular device of claim 1 wherein said molecular system has an orientation axis and wherein said rotor portion is oriented perpendicular to said orientation axis, with said external electric field applied parallel to said orientation axis.

3. The molecular device of claim 2 wherein said molecular system comprises:

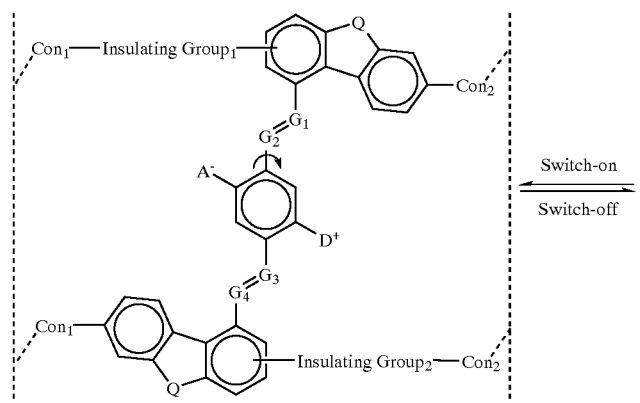

More Conductive State (On State)

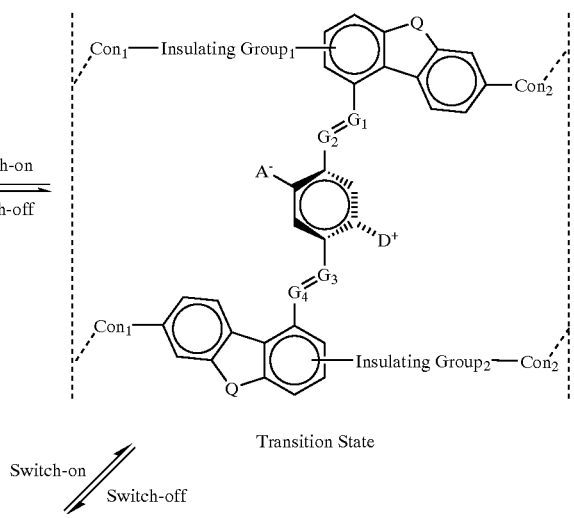

Transition State

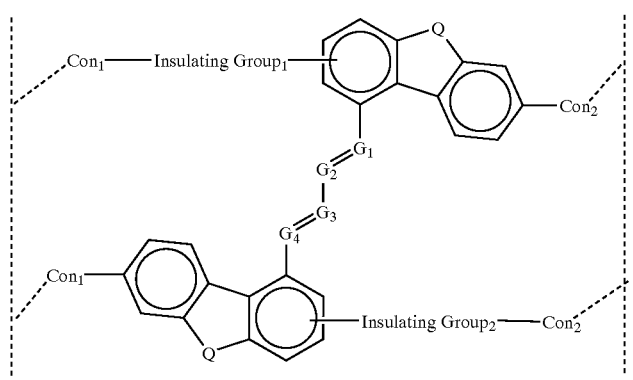

Less Conductive State (Off State)

where

A⁻ is an Acceptor group comprising an electron-withdrawing group selected from the group consisting of: (a) hydrogen, (b) carboxylic acid and its derivatives, (c) sulfuric acid and its derivatives, (d) phosphoric acid and its derivatives, (e) nitro, (f) nitrile, (g) hetero atoms selected from the group consisting of N, O, S, P, F, Cl, and Br, (h) functional group with at least one of said hetero atoms, (i) saturated or unsaturated hydrocarbons, and (j) substituted hydrocarbons;

D⁺ is a Donor group comprising an electron-donating group selected from the group consisting of: (a) hydrogen, (b) amines, (c) OH, (d) SH, (e) ethers, (f) saturated or unsaturated hydrocarbons, (h) substituted hydrocarbons, and (i) functional groups with at least one of hetero atom selected from the group consisting of B, Si, N, O, S, P, and I, wherein said Donor group is more electropositive than said Acceptor group;

$Con_1$ and $Con_2$ are connecting units between a molecule and a solid substrate selected from the group consisting of a metal electrode, an inorganic substrate, and an organic substrate, said connecting units independently selected from the group consisting of: (a) hydrogen (utilizing a hydrogen bond), (b) multivalent hetero atoms selected from the group consisting of C, N, O, S, and P, (c) functional groups containing said hetero atoms, (d) saturated or unsaturated hydrocarbons, and (d) substituted hydrocarbons;

$G_1$, $G_2$, $G_3$, and $G_4$ are bridging groups for connecting said stator to each rotor or to connect two or more conjugated rings to achieve a desired electronic property, said bridging groups selected from the group consisting of: (a) hetero atoms selected from the group consisting of N, O, S, and P, (b) functional groups with at least one of said hetero atoms, (c) saturated or unsaturated hydrocarbons, (d) substituted hydrocarbons, (e) a single atom bridge, and (f) a direct sigma bond between said rotor and each stator; and Q is a connecting unit between two phenyl rings and is selected from the group consisting of: (a) S, (b) O, (c) NH, (d) NR, (e) hydrocarbon, and (f) substituted hydrocarbon, and where the vertical dashed lines represent said solid substrate to which said molecule is electrically attached.

4. The molecular device of claim 3 wherein said molecular system comprises:

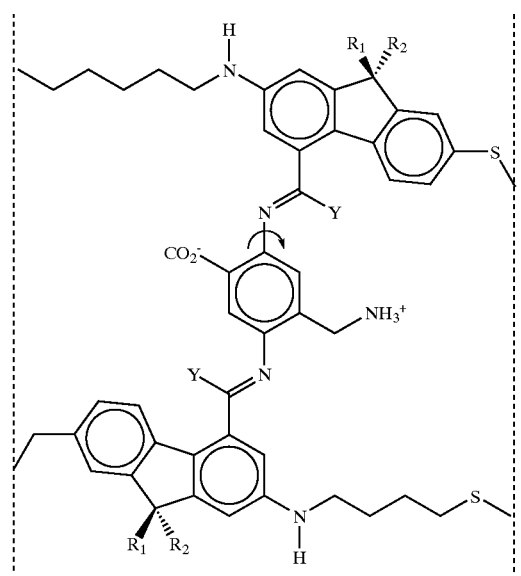
More Conductive State (On State)
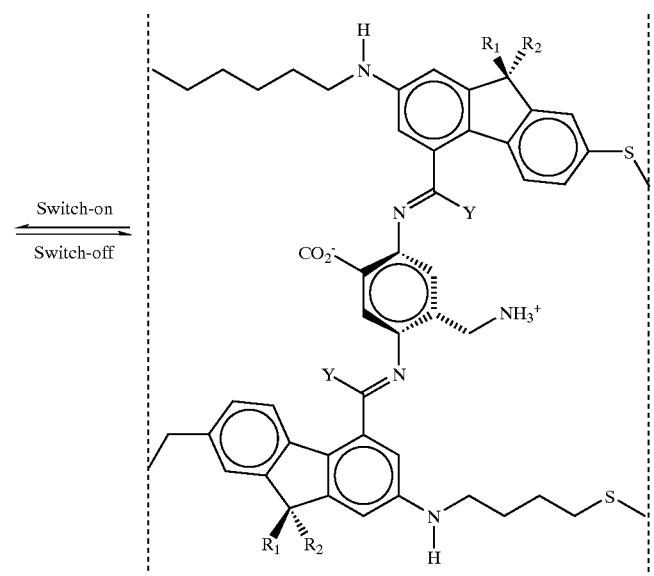
Transition State
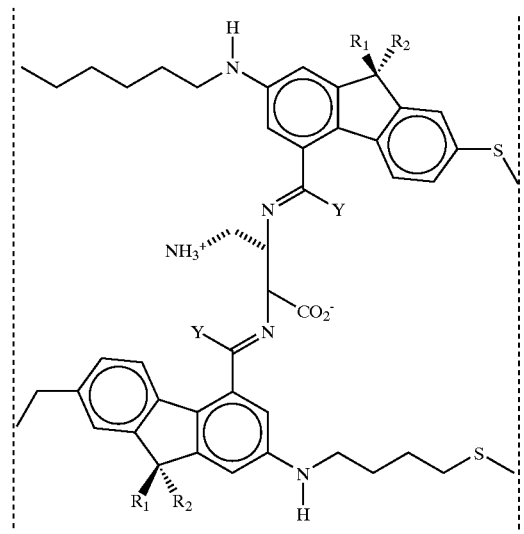
Less Conductive State (Off State)
(Y = H, SH, OH, etc. $R_1$ and $R_2$ = H, hydrocarbon etc.)

where:

R$_1$ and R$_2$ are independently hydrogen or hydrocarbon; and

Y is selected from the group consisting of hydrogen, OH, and SH.

5. The molecular device of claim 1 wherein said molecular system has an orientation axis and wherein said rotor portion is oriented parallel to said orientation axis, with said external electric field applied perpendicular to said orientation axis.

6. The molecular device of claim 5 wherein said molecular system comprises:

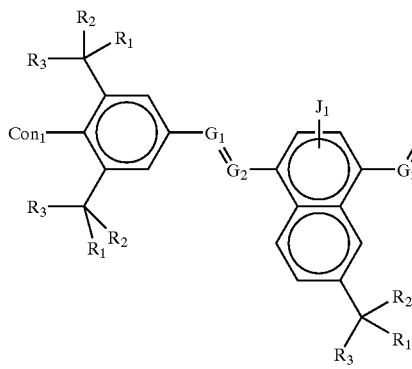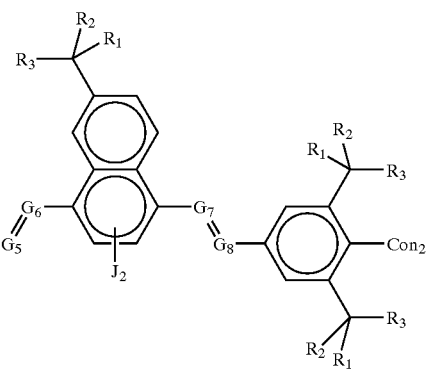

On State (More Conductive State)

Switch on ⇅ Switch off

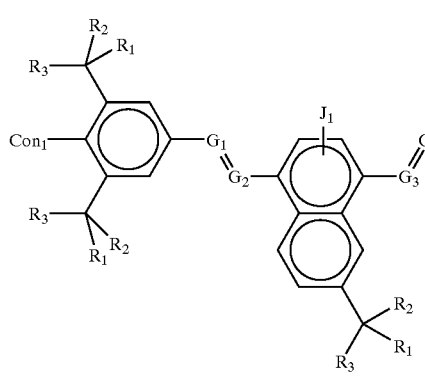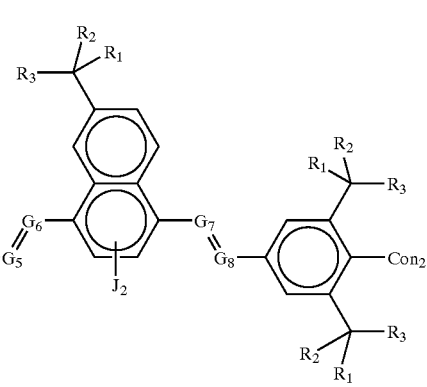

Off State (Less Conductive State)

where:

A$^-$ is an Acceptor group comprising an electron-withdrawing group selected from the group consisting of: (a) hydrogen, (b) carboxylic acid and its derivatives, (c) sulfuric acid and its derivatives, (d) phosphoric acid and its derivatives, (e) nitro, (f) nitrile, (g) hetero atoms selected from the group consisting of N, O, S, P, F, Cl, and Br, (h) functional groups with at least one of said hetero atoms, (i) saturated or unsaturated hydrocarbons, and (j) substituted hydrocarbons;

D$^+$ is a Donor group comprising an electron-donating group selected from the group consisting of: (a) hydrogen, (b) amines, (c) OH, (d) SH, (e) ethers, (f) saturated and unsaturated hydrocarbons, (g) substituted hydrocarbons, and (i) functional groups with at least one of hetero atom selected from the group consisting of B, Si, N, O, S, P, and I, wherein said Donor group is more electropositive than said Acceptor group;

Con$_1$ and Con$_2$ are connecting units between one molecule and another molecule or between a molecule and a solid substrate selected from the group consisting of a metal electrode, an inorganic substrate, and an organic substrate, said connecting units independently selected from the group consisting of: (a) hydrogen (utilizing a hydrogen bond), (b) multivalent hetero atoms selected from the group consisting of C, N, O, S, and P, (c) functional groups containing said hetero atoms, (d) saturated or unsaturated hydrocarbons, and (e) substituted hydrocarbons;

R₁, R₂ and R₃ are spacing groups for providing an appropriate 3-dimensional scaffolding to allow molecules to pack together while providing rotational space for each rotor, said spacing groups selected from the group consisting of: (a) hydrogen, (b) saturated or unsaturated hydrocarbon, and (c) substituted hydrocarbon;

G₁, G₂, G₃, G₄, G₅, G₆, G₇, and G₈ are bridging groups for connecting said stator to each rotor or to connect two or more conjugated rings to achieve a desired electronic property, said bridging groups selected from the group consisting of: (a) hetero atoms selected from the group consisting of N, O, S, and P, (b) functional groups with at least one of said hetero atoms, (c) saturated or unsaturated hydrocarbons, (d) substituted hydrocarbons, (e) a single atom bridge, and (f) a direct sigma bond between said rotor and each stator; and J₁ and J₂ are tuning groups to provide at least one appropriate functional effect selected from the group consisting of inductive effects, resonance effects, and steric effects, said tuning groups being selected from the group consisting of: (a) hydrogen, (b) hetero atoms selected from the group consisting of N, O, S, P, B, F, Cl, Br and I, (c) functional groups with at least one of said hetero atoms, (d) saturated or unsaturated hydrocarbons, and (e) substituted hydrocarbons.

7. The molecular device of claim 6 wherein said molecular system comprises:

wherein the letters A, D, E, G, and J indicate sites where different chemical units can be utilized to adjust geometrical structure and optical properties of said molecular system and have generic designations as follows: A, D, E, G, and J are independently selected from the group consisting of heteroatoms, hydrocarbons (either saturated or unsaturated), and hydrocarbons with at least one said heteroatom, and where in addition to the foregoing, the letters G and J are independently selected from the group consisting of hydrogen, F, Cl, Br, and I.

8. The molecular device of claim 1 comprising a crossed-wire device comprising a pair of crossed wires that form a junction where one wire crosses another at an angle other than zero degrees and at least one connector species connecting said pair of crossed wires in said junction, said junction having a functional dimension in nanometers, wherein said at least one connector species comprises said molecular system.

9. The molecular device of claim 8 wherein said crossed-wire device is selected from the group consisting of memories, logic devices, multiplexers, demultiplexers, configurable interconnects for integrated circuits, field-programmable gate arrays (FGPAs), cross-bar switches, and communication devices.

10. The molecular device of claim 1 wherein said molecular system is connected to said pair of electrodes by connector units.

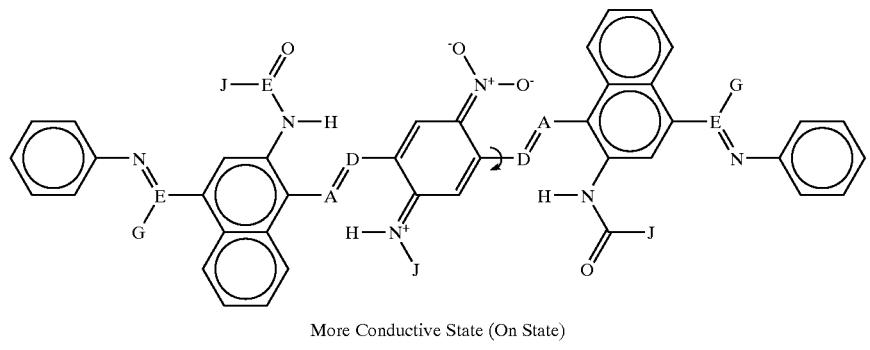

More Conductive State (On State)

Switch on | Switch off

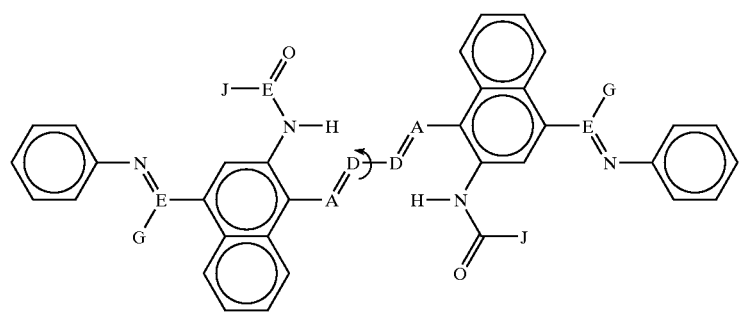

Less Conductive State (Off State)

11. The molecular device of claim 1 wherein said rotor is capable of being latched between two states separated by 10 to 170 degrees from said stators.

12. The molecular device of claim 11 wherein said rotor is capable of being latched between two states separated by approximately 90 degrees from said stators.

13. The molecular device of claim 1 wherein said molecular system includes intermolecular forces, intramolecular forces, or both, for stabilizing said rotor portion in particular orientations with respect to said two stator portions.

14. A bi-stable molecular system having one rotor portion connected between two stator portions, wherein said rotor portion has a dipole moment sufficient to be responsive to an applied electric field and wherein said rotor portion rotates with respect to said stator portions between at least two different states upon application of said electric field, thereby inducing a band gap change in said molecular system, wherein in a first state, there is substantial extended conjugation throughout said molecular system, resulting in a relatively smaller band gap, and wherein in a second state, said extended conjugation is changed, resulting in a relatively larger band gap.

15. The molecular system of claim 14 wherein said molecular system has an orientation axis and wherein said rotor portion is oriented perpendicular to said orientation axis, with said external electric field applied parallel to said orientation axis.

16. The molecular system of claim 15 comprising:

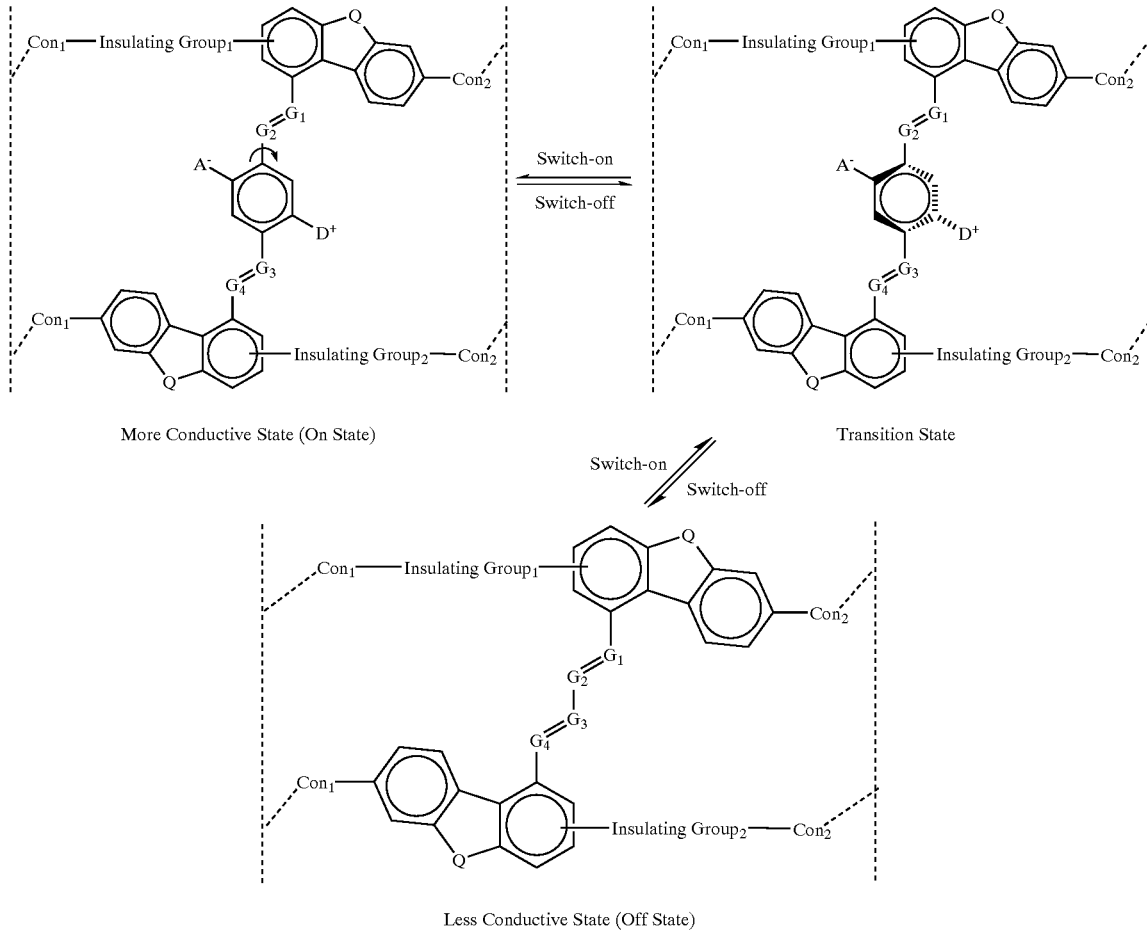

More Conductive State (On State)

Transition State

Less Conductive State (Off State)

where $A^-$ is an Acceptor group comprising an electron-withdrawing group selected from the group consisting of: (a) hydrogen, (b) carboxylic acid and its derivatives, (c) sulfuric acid and its derivatives, (d) phosphoric acid and its derivatives, (e) nitro, (f) nitrile, (g) hetero atoms selected from the group consisting of N, O, S, P, F, Cl, and Br, (h) functional group with at least one of said hetero atoms, (i) saturated or unsaturated hydrocarbons, and (j) substituted hydrocarbons; $D^+$ is a Donor group comprising an electron-donating group selected from the group consisting of: (a) hydrogen, (b) amines, (c) OH, (d) SH, (e) ethers, (f) saturated or unsaturated hydrocarbons, (h) substituted hydrocarbons, and (i) functional groups with at least one of hetero atom selected from the group consisting of B, Si, N, O, S, P, and I, wherein said Donor group is more electropositive than said Acceptor group;

$Con_1$ and $Con_2$ are connecting units between a molecule and a solid substrate selected from the group consisting of a metal electrode, an inorganic substrate, and an organic substrate, said connecting units independently selected from the group consisting of: (a) hydrogen (utilizing a hydrogen bond), (b) multivalent hetero atoms selected from the group consisting of C, N, O, S, and P, (c) functional groups containing said hetero atoms, (d) saturated or unsaturated hydrocarbons, and (d) substituted hydrocarbons;

$G_1$, $G_2$, $G_3$, and $G_4$ are bridging groups for connecting said stator to each rotor or to connect two or more conjugated rings to achieve a desired electronic property, said bridging groups selected from the group consisting of: (a) hetero atoms selected from the group consisting of N, O, S, and P, (b) functional groups with at least one of said hetero atoms, (c) saturated or unsaturated hydrocarbons, (d) substituted hydrocarbons, (e) a single atom bridge, and (f) a direct sigma bond between said rotor and each stator; and Q is a connecting unit between two phenyl rings and is selected from the group consisting of: (a) S, (b) O, (c) NH, (d) NR, (e) hydrocarbon, and (f) substituted hydrocarbon, and where the vertical dashed lines represent said solid substrate to which said molecule is electrically attached.

17. The molecular system of claim 16 comprising:

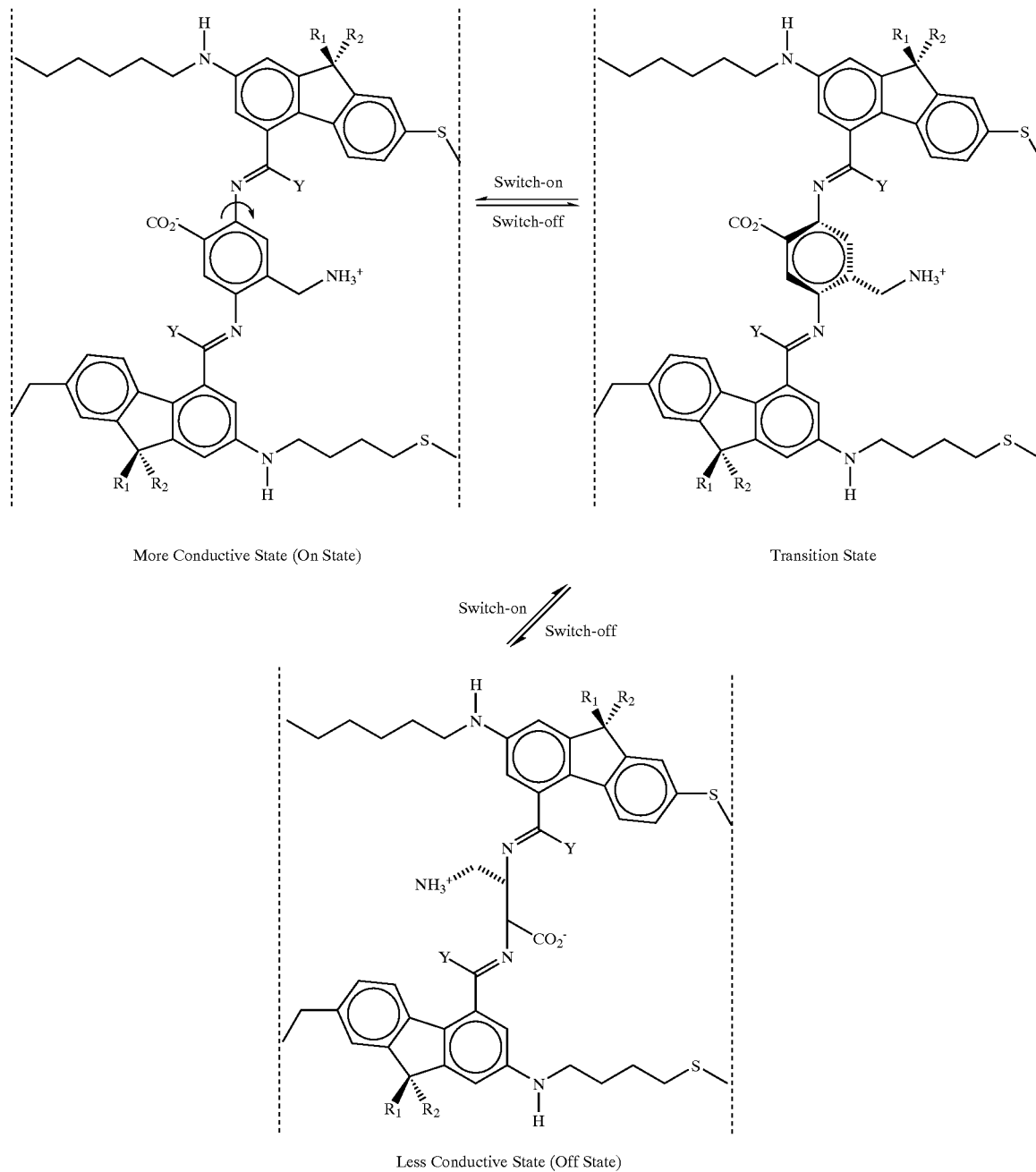

(Y = H, SH, OH, etc. $R_1$ and $R_2$ = H, hydrocarbon etc.)

where:

R₁ and R₂ are independently hydrogen or hydrocarbon; and

Y is selected from the group consisting of hydrogen, OH, and SH.

18. The molecular system of claim 14 wherein said molecular system has an orientation axis and wherein said rotor portion is oriented parallel to said orientation axis, with said external electric field applied perpendicular to said orientation axis.

19. The molecular system of claim 18 comprising:

D⁺ is a Donor group comprising an electron-donating group selected from the group consisting of: (a) hydrogen, (b) amines, (c) OH, (d) SH, (e) ethers, (f) saturated and unsaturated hydrocarbons, (g) substituted hydrocarbons, and (i) functional groups with at least one of hetero atom selected from the group consisting of B, Si, N, O, S, P, and I, wherein said Donor group is more electropositive than said Acceptor group;

Con₁ and Con₂ are connecting units between one molecule and another molecule or between a molecule and a solid substrate selected from the group consisting of a metal electrode, an inorganic substrate, and an

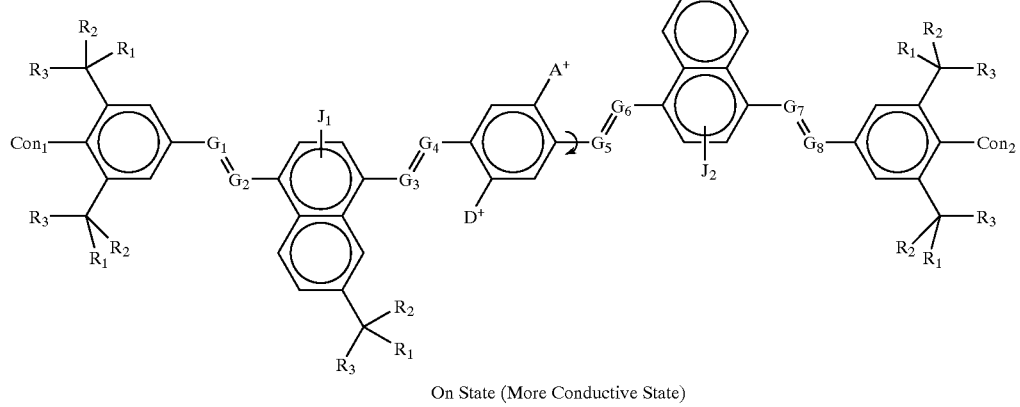

On State (More Conductive State)

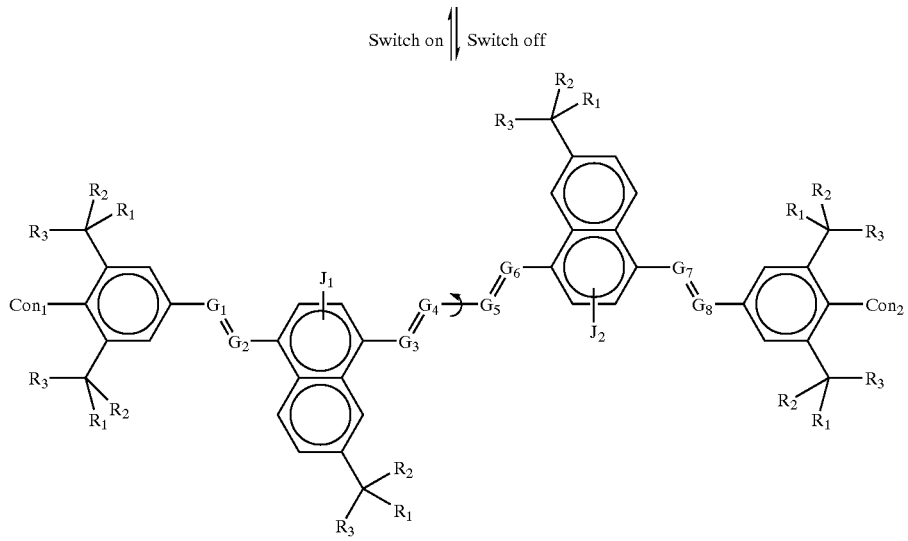

Off State (Less Conductive State)

where:

A⁻ is an Acceptor group comprising an electron-withdrawing group selected from the group consisting of: (a) hydrogen, (b) carboxylic acid and its derivatives, (c) sulfuric acid and its derivatives, (d) phosphoric acid and its derivatives, (e) nitro, (f) nitrile, (g) hetero atoms selected from the group consisting of N, O, S, P, F, Cl, and Br, (h) functional groups with at least one of said hetero atoms, (i) saturated or unsaturated hydrocarbons, and (j) substituted hydrocarbons;

organic substrate, said connecting units independently selected from the group consisting of: (a) hydrogen (utilizing a hydrogen bond), (b) multivalent hetero atoms selected from the group consisting of C, N, O, S, and P, (c) functional groups containing said hetero atoms, (d) saturated or unsaturated hydrocarbons, and (e) substituted hydrocarbons;

R₁, R₂ and R₃ are spacing groups for providing an appropriate 3-dimensional scaffolding to allow molecules to pack together while providing rotational space for each rotor, said spacing groups selected from the group consisting of: (a) hydrogen, (b) saturated or unsaturated hydrocarbon, and (c) substituted hydrocarbon;

$G_1$, $G_2$, $G_3$, $G_4$, $G_5$, $G_6$, $G_7$, and $G_8$ are bridging groups for connecting said stator to each rotor or to connect two or more conjugated rings to achieve a desired electronic property, said bridging groups selected from the group consisting of: (a) hetero atoms selected from the group consisting of N, O, S, and P, (b) functional groups with at least one of said hetero atoms, (c) saturated or unsaturated hydrocarbons, (d) substituted hydrocarbons, (e) a single atom bridge, and (f) a direct sigma bond between said rotor and each stator; and $J_1$ and $J_2$ are tuning groups to provide at least one appropriate functional effect selected from the group consisting of inductive effects, resonance effects, and steric effects, said tuning groups being selected from the group consisting of: (a) hydrogen, (b) hetero atoms selected from the group consisting of N, O, S, P, B, F, Cl, Br and I, (c) functional groups with at least one of said hetero atoms, (d) saturated or unsaturated hydrocarbons, and (e) substituted hydrocarbons.

20. The molecular system of claim 19 comprising:

wherein the letters A, D, E, G, and J indicate sites where different chemical units can be utilized to adjust geometrical structure and optical properties of said molecular system and have generic designations as follows: A, D, E, G, and J are independently selected from the group consisting of heteroatoms, hydrocarbons (either saturated or unsaturated), and hydrocarbons with at least one said heteroatom, and where in addition to the foregoing, the letters G and J are independently selected from the group consisting of hydrogen, F, Cl, Br, and I.

21. The molecular system of claim 14 wherein said rotor is capable of being latched between two states separated by 10 to 170 degrees from said stators.

22. The molecular system of claim 21 wherein said rotor is capable of being latched between two states separated by approximately 90 degrees from said stators.-

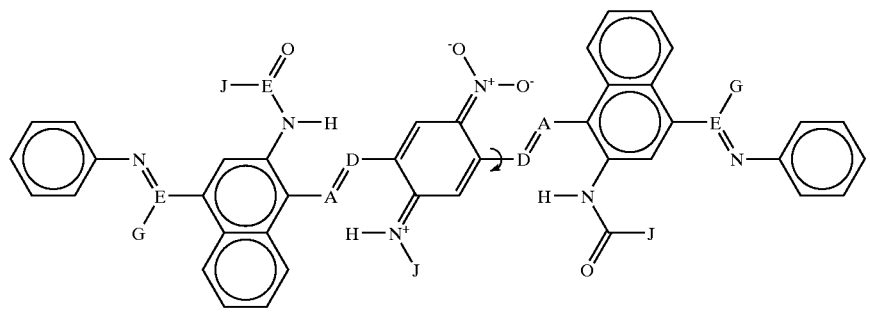

More Conductive State (On State)

Switch on | Switch off

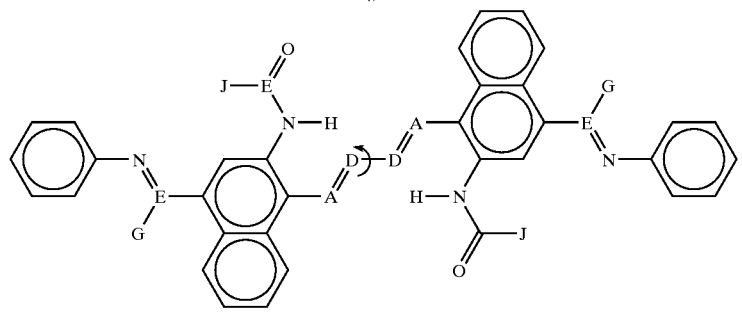

Less Conductive State (Off State)

23. The molecular system of claim 14 including intermolecular forces, intramolecular forces, or both, for stabilizing said rotor portion in particular orientations with respect to said two stator portions.

* * * * *

UNITED STATES PATENT AND TRADEMARK OFFICE
CERTIFICATE OF CORRECTION

PATENT NO. : 6,920,260 B2
APPLICATION NO. : 10/660277
DATED : July 19, 2005
INVENTOR(S) : Zhang et al.

Page 1 of 1

It is certified that error appears in the above-identified patent and that said Letters Patent is hereby corrected as shown below:

Please amend item (60) on Title Page of the patent as follows:

(60) Division of "application No. 10/003,869, filed on Oct. 24, 2001, now Pat. No. 6,830,842, which is a continuation of" application No.09/846,135, filed on April 30, 2001, now Pat. No. 6,674,932, which is a continuation-in-part of application No. 09/823,195, filed on Mar. 29, 2001, which is a continuation-in-part of application No. 09/759,438, filed on Jan. 12, 2001, now Pat. No. 6,512,119, which is a continuation-in-part of application No. 09/738,793, filed on Dec. 14, 2000, now Pat. No. 6,663,797.

Please amend the paragraph starting on line 9 of Col. 1 as follows:

The present application is a "division of Ser. No. 10/003,869, filed on Oct. 24, 2001, now U.S. Pat. No. 6,830,842, which is a" divisional application of Ser. No.09/846,135, filed on April 30, 2001, now U.S. Pat. No. 6,674,932, which is a continuation-in-part application of Ser. No. 09/823,195, filed on Mar. 29, 2001, which is a continuation-in-part application of Ser. No. 09/759,438, filed on Jan. 12, 2001, now U.S. Pat. No. 6,512,119, which is a continuation-in-part application of Ser. No. 09/738,793, filed on Dec. 14, 2000 now U.S. Pat. No. 6,663,797.

Signed and Sealed this

Twenty-first Day of November, 2006

JON W. DUDAS
*Director of the United States Patent and Trademark Office*